(12) United States Patent
Abiko

(10) Patent No.: US 6,878,208 B2
(45) Date of Patent: Apr. 12, 2005

(54) MASK FOR VACUUM DEPOSITION AND ORGANIC EL DISPLAY MANUFACTURED BY USING THE SAME

(75) Inventor: Hirosi Abiko, Yonezawa (JP)

(73) Assignee: Tohoku Pioneer Corporation, Tendo (JP)

( * ) Notice: Subject to any disclaimer, the term of this patent is extended or adjusted under 35 U.S.C. 154(b) by 240 days.

(21) Appl. No.: 10/259,664

(22) Filed: Sep. 30, 2002

(65) Prior Publication Data

US 2003/0201711 A1 Oct. 30, 2003

(30) Foreign Application Priority Data

Apr. 26, 2002 (JP) ........................................ 2002-125276

(51) Int. Cl.⁷ ........................... C23C 16/04; C23C 14/04
(52) U.S. Cl. .................. 118/720; 118/504; 204/298.11
(58) Field of Search ................................ 118/720, 721, 118/504, 505; 204/298.11

(56) References Cited

U.S. PATENT DOCUMENTS

| | | | | |
|---|---|---|---|---|
| 4,372,248 A | * | 2/1983 | Martin | ........................ 118/720 |
| 5,979,312 A | * | 11/1999 | Williams | ..................... 101/127 |
| 6,469,439 B2 | * | 10/2002 | Himeshima et al. | ........ 313/506 |
| 6,475,287 B1 | * | 11/2002 | Clark | .......................... 118/721 |
| 2003/0101932 A1 | * | 6/2003 | Kang | .......................... 118/504 |
| 2003/0152691 A1 | * | 8/2003 | Baude et al. | .................. 427/96 |
| 2003/0201711 A1 | * | 10/2003 | Abiko | ......................... 313/504 |
| 2004/0020435 A1 | * | 2/2004 | Tsuchiya et al. | ....... 118/723 VE |
| 2004/0115342 A1 | * | 6/2004 | Shigemura | ................... 427/143 |
| 2004/0163592 A1 | * | 8/2004 | Abiko et al. | ................. 118/715 |

FOREIGN PATENT DOCUMENTS

| | | | | |
|---|---|---|---|---|
| JP | 2000-015777 A | * | 1/2000 | |
| JP | 2003-332056 A | * | 11/2003 | |
| JP | 2003-332057 A | * | 11/2003 | |
| WO | WO 03/019988 A1 | * | 3/2004 | |

* cited by examiner

Primary Examiner—Jeffrie R. Lund
(74) Attorney, Agent, or Firm—Westerman, Hattori, Daniels & Adrian, LLP

(57) ABSTRACT

A mask for vacuum deposition cthat is held by a mask frame is provided. The mask comprises a mask body for deposition; a guide member fixed to at least one side of the mask body for deposition; and tension applying means that, when the guide member is held by the mask frame, applies a predetermined tension to the mask body for deposition via the guide member.

11 Claims, 3 Drawing Sheets

[Fig. 1]
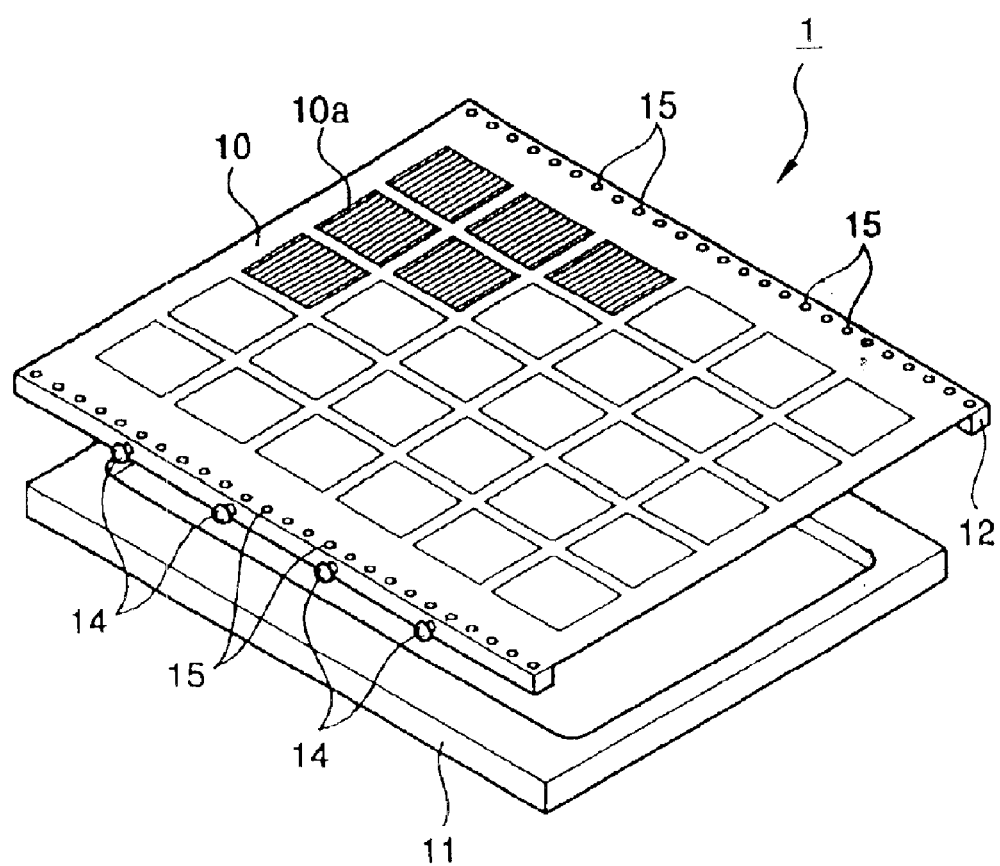

[Fig. 2]
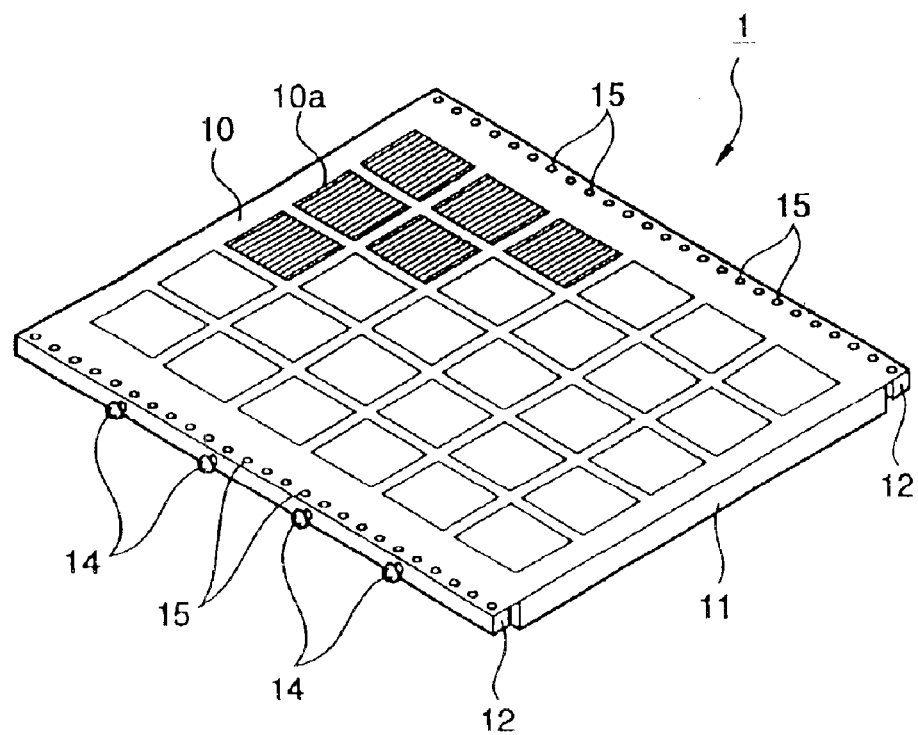
[Fig. 3]
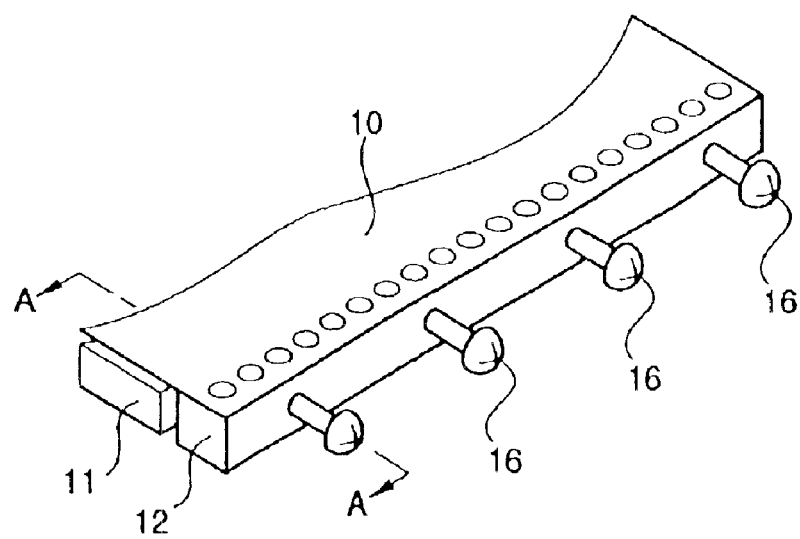

[Fig. 4]
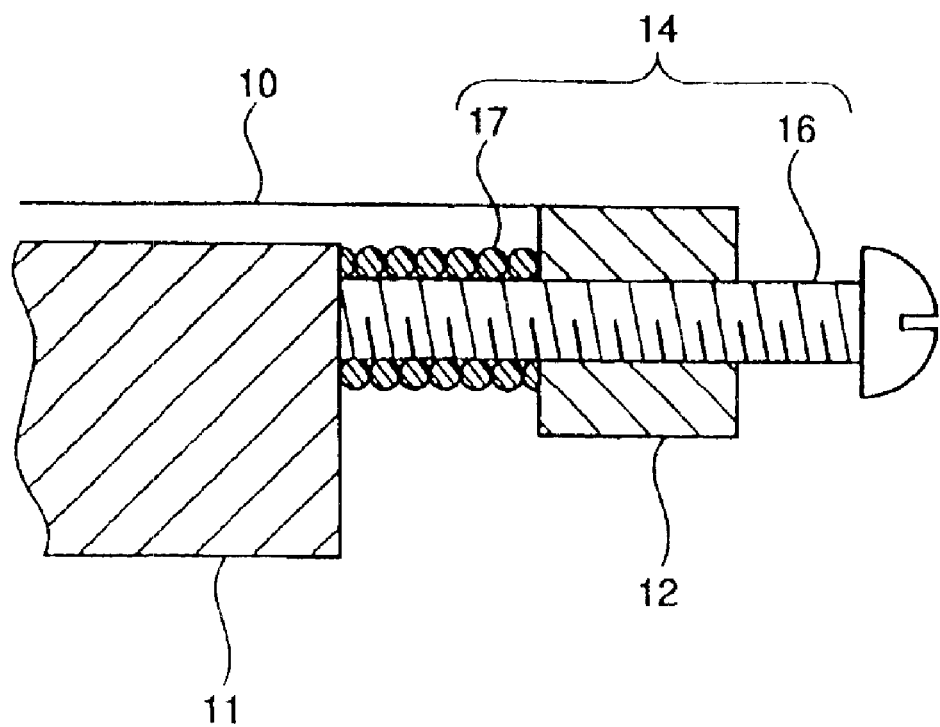
[Fig. 5]
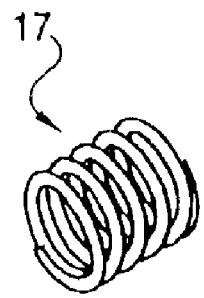

MASK FOR VACUUM DEPOSITION AND ORGANIC EL DISPLAY MANUFACTURED BY USING THE SAME

BACKGROUND OF THE INVENTION

1. Field of the Invention

The present invention relates to a mask for vacuum deposition and an organic EL display panel manufactured by using the same.

2. Description of the Related Art

In recent years, in the pixels of a light emitting device such as an organic EL, as colorization goes forward, a minimum pitch between RGB has been made as fine as nearly 50 µm and additionally, a study of making the pitch finer has been also conducted.

On the other hand, the size of a mask for vacuum deposition used for manufacturing the organic EL is as large as about from 400 mm to 500 mm and there has been a tendency for the mask for vacuum deposition to become larger with the increasing size of a display panel using the organic EL. In this manner, there has been a tendency that the mask for vacuum deposition used for manufacturing the light emitting device such as organic EL is made larger in size and that a mask pitch between its mask patterns is made narrower.

If the mask pitch of the mask for vacuum deposition that is made larger in size is made narrower, as described above, then the rigidity of the mask for vacuum deposition itself is decreased and thus when the mask for vacuum deposition is fixed to a mask frame of its holding member, a deflection is produced.

In order to remove the deflection, it is necessary to apply a tension to the mask for vacuum deposition. For this reason, in the related art, in the state where a tension is applied to the mask for vacuum deposition to remove the deflection, the end portion of the mask for vacuum deposition is bonded to the mask frame with an adhesive or is fixed welded thereto by welding, or is clamped with screws.

However, the conventional method of fixing the mask for vacuum deposition to the mask frame presents a problem that since it is difficult to adjust the tension of the mask for vacuum deposition after it is fixed, it is impossible to correct the mask for vacuum deposition when it is deflected by some causes after it is fixed.

Further, the above-described method in the related art presents a problem that since it is difficult to dismount the mask for vacuum deposition from the mask frame, it is difficult to clean the mask for vacuum deposition and to change the mask for vacuum deposition when the mask pattern of the mask for vacuum deposition is changed. Still further, the method in the related art presents a problem that since it is difficult to dismount the mask for vacuum deposition, the mask frame can not be used again.

SUMMARY OF THE INVENTION

The present invention has been made to solve the above-mentioned problems. It is the object of the present invention to provide a mask for vacuum deposition that is not directly fixed to a mask frame so that the tension of the mask for vacuum deposition can be adjusted in a state where it is held by the mask frame and that can be easily removed from the mask frame, and an organic EL display panel manufactured by using the same.

A mask for vacuum deposition in accordance with the present invention to achieve the above-mentioned object is a mask for vacuum deposition that is held by a mask frame and is characterized by a mask body for deposition, a guide member fixed to at least one side of the mask body for deposition, and tension applying means that, when the guide member is held by the mask frame, applies a predetermined tension to the mask body for deposition via the guided member.

As described above, since the mask for deposition is not directly fixed to the mask frame, the mask for deposition can be easily dismounted from the mask frame. Further, since a predetermined tension is applied to at least one side of the mask frame, when the mask for deposition is held by the mask frame, the deflection of the maskbody for deposition can be prevented.

Here, it is preferable that the above-mentioned mask body for deposition has a mask pattern in which apertures are arranged in a predetermined pattern and has the guide member fixed to at least one side in the direction perpendicular to the direction of length of the aperture.

This makes it possible to apply a tension in the direction along the arrangement of the predetermined pattern and to stretch the mask body for deposition so as to prevent the deflection of the mask body for deposition. Therefore, deposited pixels can be formed in more accurate shapes.

Further, it is preferable that the guide members are fixed to the two sides of the mask body for deposition that are opposed to each other.

This makes it possible to apply a tension in two directions of front and back directions or right and left directions and thus to prevent the deflection of the mask for deposition more surely.

It is preferable that the guide members are fixed to the four sides of the mask body for deposition.

This makes it possible to apply a tension in four directions, that is, in all directions of front and back directions and right and left directions and thus to more surely prevent the deflection of the mask for deposition. Moreover, one of the respective sides opposed to each other may be directly bonded to a tray.

Further, it is preferable that the tension applying means includes a through hole formed in the side wall of the guide member and a screw which is passed through the through hole and whose tip portion is screwed into a screw hole made in the side wall of the mask frame.

Such tension applying means makes it possible to prevent the deflection of the mask for deposition more surely and easily.

Here, it is preferable that a spring member is provided between the mask frame and the guide member. Preferably, the spring member is a compression spring. The spring member may be a leaf spring.

Still further, it is preferable that the tension applying means includes a through hole formed in the side wall of the guide member, a screw which is inserted into the through hole and whose tip portion is made to abut against the side wall of the mask frame, and a spring member provided between the mask frame and the guide member.

Such tension applying means also makes it possible to prevent the deflection of the mask for deposition more surely and easily.

Here, it is preferable that a spring member is provided between the mask frame and the guide member. Preferably, the spring member is a compression spring. The spring member may be a leaf spring.

Moreover, an organic EL display panel in accordance with the present invention is characterized in that it is manufactured by the use of any one of the above-mentioned mask for vacuum deposition.

The use of any one of the above-mentioned masks for vacuum deposition makes it possible to form deposited pixels in more accurate shapes in the organic EL display panel made of a light emitting device having a finer pixel pitch and thus to produce an organic EL display panel capable of displaying an image of high quality.

BRIEF DESCRIPTION OF THE DRAWINGS

FIG. 1 is a perspective view to show a mask for vacuum deposition in an embodiment in accordance with the present invention and is illustrative of a state where the mask for vacuum deposition is dismounted from a mask frame;

FIG. 2 is a perspective view to show a mask for vacuum deposition in an embodiment in accordance with the present invention and is illustrative a state where the mask for vacuum deposition is mounted on a mask frame;

FIG. 3 is a perspective view to show a main part of the embodiment in accordance with the present invention;

FIG. 4 is a cross-sectional view taken on a line A—A in FIG. 3; and

FIG. 5 is a perspective view of a compression coil spring.

DESCRIPTION OF THE PREFERRED EMBODIMENTS

In the preferred embodiments, a case will be described in detail where a mask for vacuum deposition in accordance with the present invention is applied to the vacuum deposition of an organic layer when an organic EL display panel is manufactured. FIG. 1 and FIG. 2 illustrate a mask for vacuum deposition in an embodiment in accordance with the present invention.

The mask 1 for vacuum deposition in an embodiment in accordance with the present invention is used for forming an organic EL device and is held by a mask frame 11 in a deposition process (mainly in forming an organic layer) when the organic EL device is manufactured.

As shown in FIG. 1, the mask 1 for vacuum deposition has a mask body 10 for deposition, guide members 12, and tension applying means 14.

The mask body 10 for deposition and the mask frame 11 is formed of stainless steel such as SUS344, SUS303, SUS316, SUS430, Ti (titanium), other metals, or ceramics. Further, the mask frame 11 is formed in a thickness of from 1 mm to 100 mm, preferably, from 4 mm to 30 mm.

Further detailing the mask for vacuum deposition, as shown in FIG. 1 two sides of the mask body 10 for vacuum deposition, which are opposed to each other, are fixed to the guide members 12, 12 by spot welding 15 and the like. In fixing the mask body 10 for vacuum deposition to the guide members 12, 12, it is essential that the mask body 10 for vacuum deposition be fixed to the guide members 12, 12, so that means such as an adhesive or a clamp may be used.

Then, these guide members 12, 12 is nearly as long as the mask body 10 for vacuum deposition.

Moreover, these guide members 12, 12 are mounted with means 14 for applying a predetermined tension to the mask 10 for vacuum deposition.

Then, on the mask body 10 for deposition are formed mask patterns 10a. The mask patterns 10a are used for depositing pixels for constituting the organic EL display and are formed on the mask body 10 for deposition in the shape of a grid having a fine pitch.

Each of the mask patterns 10a formed in the shape of a grid has a plurality of apertures arranged in a predetermined pattern. The apertures arranged in the mask pattern 10a are formed in the shape of a slit, a slot, a circle and the like and are arranged in a square, in a stagger and the like.

If a tension is applied to the mask body 10 for deposition in the direction along the arrangement of the apertures of the mask patterns 10a (which is shown as streaks in the mask pattern 10a in FIG. 1, FIG. 2) to stretch the mask body 10 for deposition so as to remove its deflection, it is possible to form the pixels to be deposited in more accurate shapes.

For this reason, as shown in FIG. 1, FIG. 2, the guide members 12, 12 are fixed to the two sides of the mask body 10 for deposition which are arranged in the direction perpendicular to the direction of length of the apertures (which is shown as streaks in the mask pattern 10a in FIG. 1, FIG. 2) of the mask pattern 10a and are opposed to each other.

Then, as shown in FIG. 2, by mounting the mask 1 for vacuum deposition on the mask frame 11, a deposition operation can be performed.

Further, a structure for applying a tension to the mask body 10 for deposition when the mask 1 for vacuum deposition is mounted on the mask frame 11 will be described in detail.

FIG. 3 is a perspective view to show a main part of an embodiment in accordance with the present invention in order to describe a structure for applying a tension to the mask body 10 for deposition. FIG. 4 is a cross-sectional view taken on a line A—A in FIG. 3.

FIG. 3 is an illustration to show one side to which the guide member 12 in FIG. 1 is fixed and in which screws 16, which are the parts of the tension applying means 14, are fixed to the side surface of the guide member 12.

Further, describing the tension applying means 14 in detail, as shown in the cross-sectional view in FIG. 4, through holes are made in the side wall of the guide member 12 and the tip of the screw 16 passed through the through hole is screwed into a screw hole (which is not shown) made in the side wall of the mask frame 11. That is, by turning the screw 16, the guide member 12 through which the screw 16 is passed is moved to thereby adjust a tension applied to the mask body 10.

Moreover, a compression coil spring 17 that is a spring member shown in FIG. 5, for example, is put on the screw 16 between the mask frame 11 and the guide member 12 and, the tension of the compression coil spring 17 moves the guide member 12 and can add a tension applied to the mask body 10. This produces an effect that the screw 16 and the guide member 12 can be prevented from rattling.

A method of adjusting the tension of the mask body 10 includes a method of bringing the mask body 10 into a state where the mask body 10 is not wrinkled visually, a method of measuring the torque of the respective screws and making the torque a fixed value, and a method of adjusting the respective screws so that the error between an alignment mark on the mask and an alignment mark on a scale is smaller than a predetermined value.

In this respect, the above-mentioned spring member may be a leaf spring in place of the compression coil spring 17. Moreover, it is also recommended that a through hole through which the shaft of the screw 16 is passed be made in the side wall of the guide member 12 and that the tip of the screw 16 be screwed into a screw hole (which is not shown) made in the side wall of the mask frame 11 and that the compression coil spring 17, which is a spring member shown in FIG. 5, be provided between the mask frame 11 and the guide member 12. The tensile force of this compression coil spring 17 moves the guide member 12 to add a tension applied to the mask body 10.

Here, by adjusting the length of protrusion of the screw 16 from the side wall of the mask frame 11, a tension applied to the mask body 10 can be adjusted.

A standard screw such as M2 to M5 may be used as the screw 16 described above. Here, the pitch of M2 is 0.4 mm, the pitch of M3 is 0.5 mm, the pitch of M4 is 0.7 mm, and the pitch of M5 is 0.8 mm.

As described above, in the mask 1 for vacuum deposition in accordance with the present embodiment, the guide members 12, 12 can be removed from the mask frame 11 by turning the screws 16 and thus the mask body 10 for deposition can be easily dismounted from the mask frame 11.

Therefore, the mask body 10 for deposition and the mask frame 11 can be easily cleaned, and when the mask pattern 10a is changed, the mask body 10 for deposition can be easily changed by reusing the mask frame 11.

Incidentally, in the above-mentioned embodiment, the guide members 12, 12 are fixed to the two sides of the mask body 10 for deposition which are opposed to each other to apply the tension to the mask body 10 for deposition. By fixing the guide members 12 to the respective four sides of the mask body 10 for deposition, however, it is also possible to apply the tension to the four sides of the mask body 10 for deposition and, in this case, it is possible to more surely prevent the deflection of the mask body 10 for deposition.

As described above in detail, according to the mask for vacuum deposition in accordance with the present invention, it is possible to adjust the tension of the mask for deposition in a state where it is held by the mask frame and to easily dismount the mask for deposition from the mask frame.

Moreover, according to the organic EL display panel in accordance with the present invention, deposited pixels can be formed in more accurate shapes, which makes it possible to display an image of high quality.

What is claimed is:

1. A mask for vacuum deposition that is held by a mask frame, the mask comprising:
    a mask body for deposition;
    a guide member fixed to at least one side of the mask body for deposition; and
    tension applying means that, when the guide member is held by the mask frame, applies a predetermined tension to the mask body for deposition via the guide member.

2. A mask for vacuum deposition as claimed in claim 1, wherein the mask body for deposition has a mask pattern in which apertures are arranged in a predetermined pattern and has the guide member fixed to at least one side in the direction perpendicular to the direction of length of the aperture.

3. A mask for vacuum deposition as claimed in claim 2, wherein guide members are fixed to two sides of the mask body for deposition that are opposed to each other.

4. A mask for vacuum deposition as claimed in claim 1, wherein guide members are fixed to four sides of the mask body for deposition.

5. A mask for vacuum deposition as claimed in any one of claims 1 to 4, wherein the tension applying means includes a screw hole formed in the side wall of the guides member and a screw which is screwed into the screw hole and whose its tip portion is made to abut against the side wall of the mask frame.

6. A mask for vacuum deposition as claimed in claim 5, wherein a spring member is provided between the mask frame and the guide member.

7. A mask for vacuum deposition as claimed in claim 6, wherein the spring member is a compression spring.

8. A mask for vacuum deposition as claimed in claim 6, wherein the spring member is a leaf spring.

9. A mask for vacuum deposition as claimed in any one of claims 1 to 4, wherein the tension applying means includes a through hole formed in the side wall of the guide member, a screw which is passed through the through hole and whose tip portion is screwed into a screw hole made in the side wall of the mask frame, and a spring member provided between the mask frame and the guide member.

10. A mask for vacuum deposition as claimed in claim 9, wherein the spring member is a compression spring.

11. A mask for vacuum deposition as claimed in claim 9, wherein the spring member is a leaf spring.

* * * * *